United States Patent
Aizawa et al.

(10) Patent No.: US 12,148,488 B2
(45) Date of Patent: Nov. 19, 2024

(54) MEMORY SYSTEM AND MEMORY OPERATION

(71) Applicant: SONY SEMICONDUCTOR SOLUTIONS CORPORATION, Kanagawa (JP)

(72) Inventors: Midori Aizawa, Kanagawa (JP); Masami Kuroda, Kanagawa (JP); Haruko Takahashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/005,046

(22) PCT Filed: May 20, 2021

(86) PCT No.: PCT/JP2021/019164
§ 371 (c)(1),
(2) Date: Jan. 10, 2023

(87) PCT Pub. No.: WO2022/018950
PCT Pub. Date: Jan. 27, 2022

(65) Prior Publication Data
US 2023/0260587 A1    Aug. 17, 2023

(30) Foreign Application Priority Data

Jul. 20, 2020   (JP) .................................. 2020-124039

(51) Int. Cl.
*G11C 29/10*    (2006.01)
*G06F 11/22*    (2006.01)

(52) U.S. Cl.
CPC .......... *G11C 29/10* (2013.01); *G06F 11/2215* (2013.01)

(58) Field of Classification Search
None
See application file for complete search history.

(56) References Cited

U.S. PATENT DOCUMENTS 4,571,546 A * 2/1986 Wilkinson .............. G06F 7/582
                                                             708/250
8,595,680 B1 * 11/2013 Steinberg ......... G11C 29/56008
                                                             703/22

(Continued)

FOREIGN PATENT DOCUMENTS

JP    2001-344094 A   12/2001
JP    2005-078431 A   3/2005

(Continued)

OTHER PUBLICATIONS

T. C. May and M. H. Woods, "Alpha-particle-induced soft errors in dynamic memories," in IEEE Transactions on Electron Devices, vol. 26, No. 1, pp. 2-9, Jan. 1979, doi: 10.1109/T-ED. 1979. 19370. (Year: 1979).*

(Continued)

*Primary Examiner* — Daniel F. McMahon
(74) *Attorney, Agent, or Firm* — CHIP LAW GROUP

(57) ABSTRACT

A memory system according to an aspect of the present disclosure includes a soft error generator that generates write data or read data considering a probability error by using a specific number as a random number. In the memory system, the write data or the read data considering a probability error is generated by using the random number. Herein, whether or not an error occurs is randomly changed depending on the random number. Accordingly, an error stochastically occurs, which makes it possible to reproduce a soft error.

12 Claims, 10 Drawing Sheets

(56) References Cited

U.S. PATENT DOCUMENTS

| | | | | |
|---|---|---|---|---|
| 2005/0086572 | A1* | 4/2005 | Hirabayashi | H03M 13/01 |
| | | | | 714/E11.034 |
| 2012/0079346 | A1* | 3/2012 | Fukuda | H03M 13/01 |
| | | | | 714/E11.044 |
| 2012/0121084 | A1* | 5/2012 | Tomlinson | H04L 9/30 |
| | | | | 380/30 |
| 2013/0094649 | A1* | 4/2013 | Tomlinson | H04L 9/3026 |
| | | | | 380/30 |
| 2014/0281762 | A1* | 9/2014 | Norrie | H03M 13/3905 |
| | | | | 714/703 |

FOREIGN PATENT DOCUMENTS

| | | |
|---|---|---|
| JP | 2008-090646 A | 4/2008 |
| JP | 2008-181609 A | 8/2008 |
| JP | 2008-217848 A | 9/2008 |
| JP | 2012-073678 A | 4/2012 |

OTHER PUBLICATIONS

International Search Report and Written Opinion of PCT Application No. PCT/JP2021/019164, issued on Jul. 13, 2021, 08 pages of ISRWO.

\* cited by examiner

[FIG. 1]
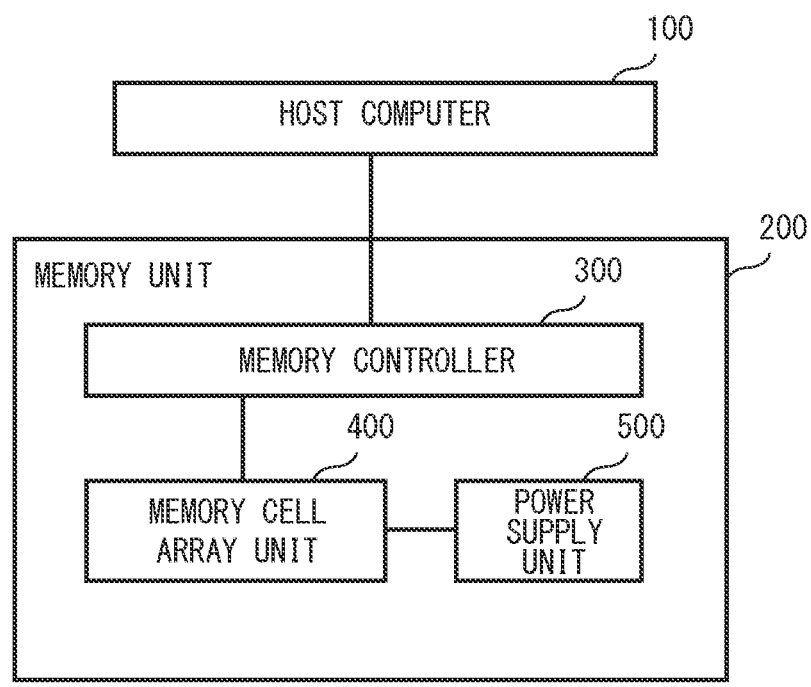

[FIG. 2]
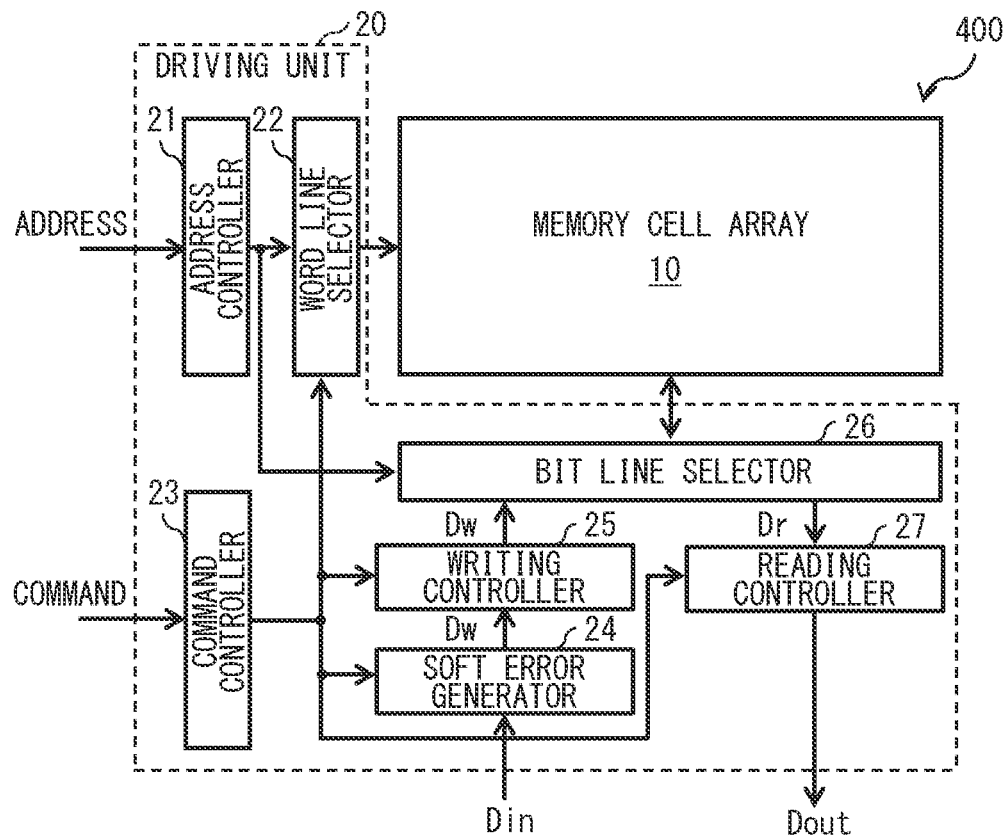
[FIG. 3]
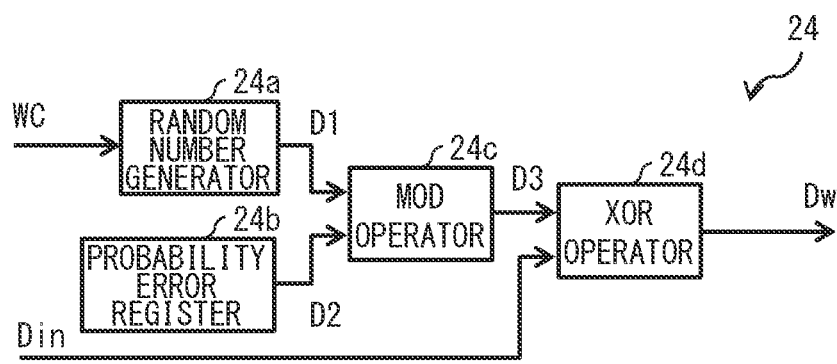

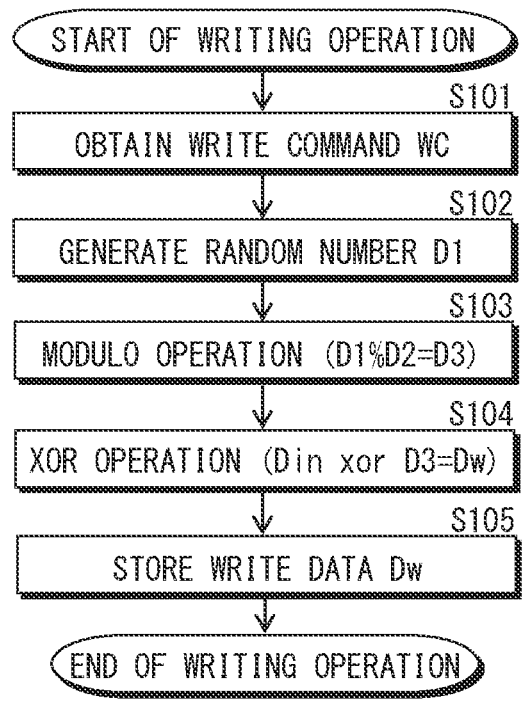
[ FIG. 4 ]

[ FIG. 5 ]
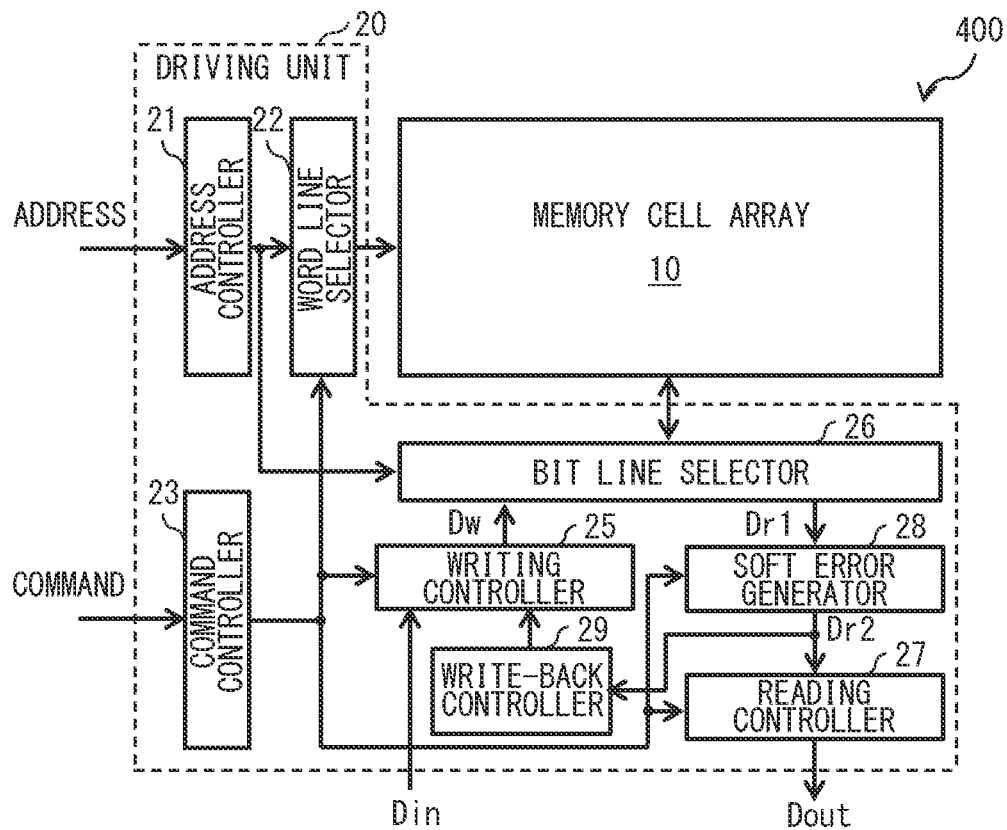
[ FIG. 6 ]
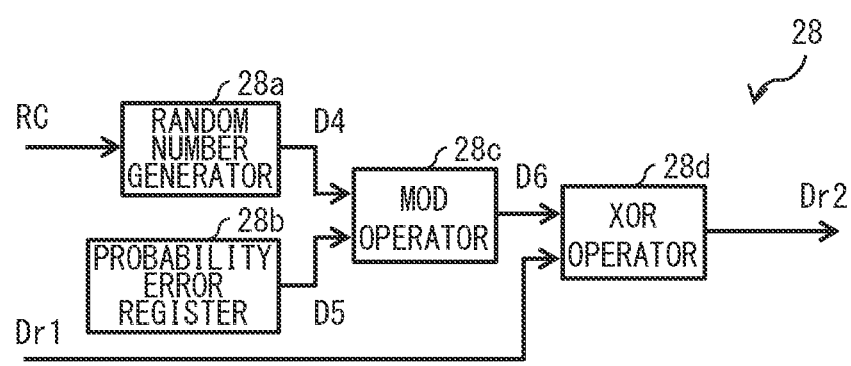

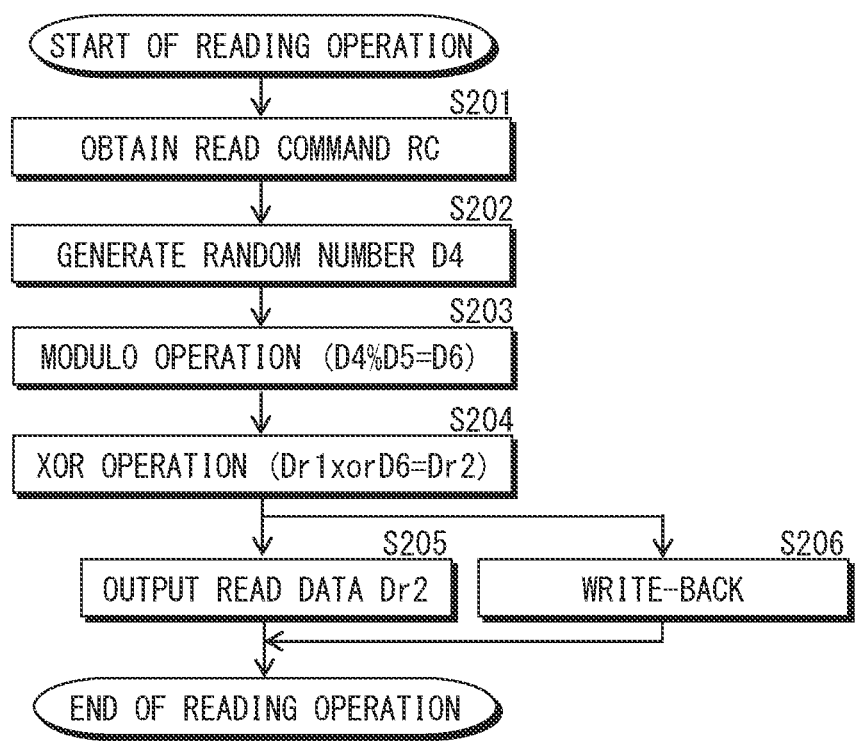
[FIG. 7]

[ FIG. 8 ]
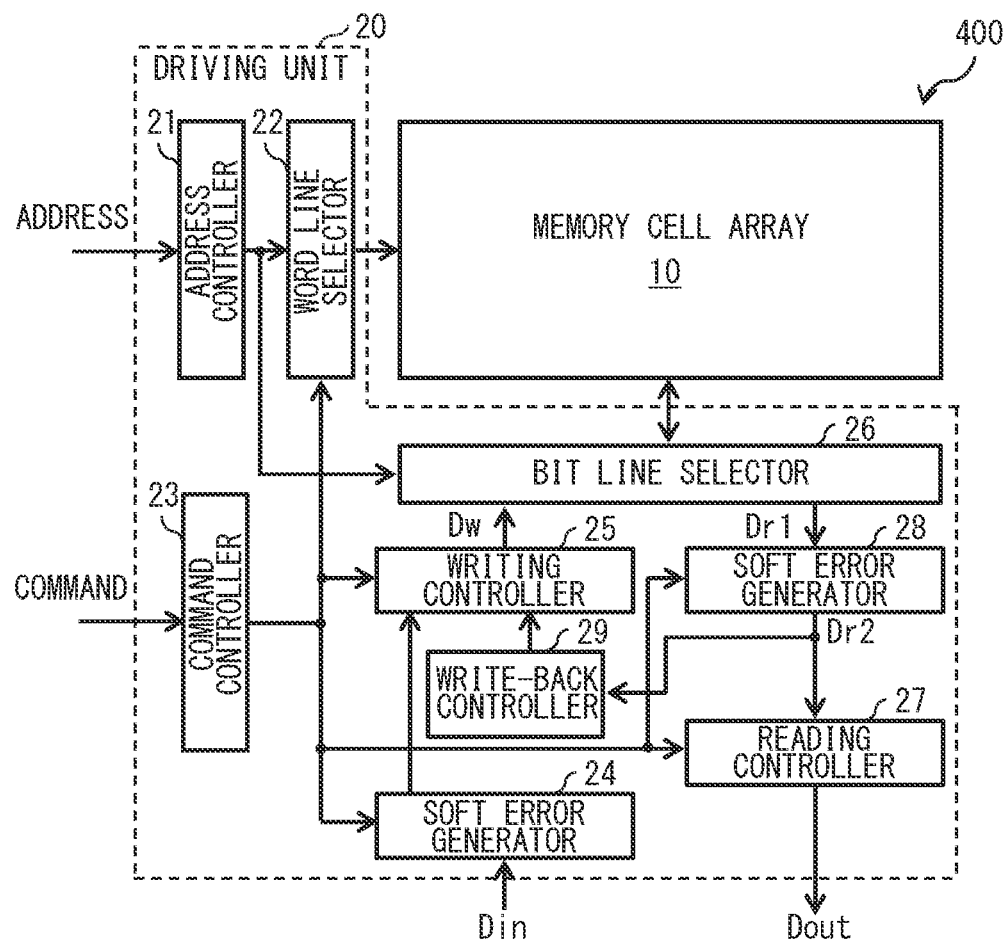

[ FIG. 9 ]
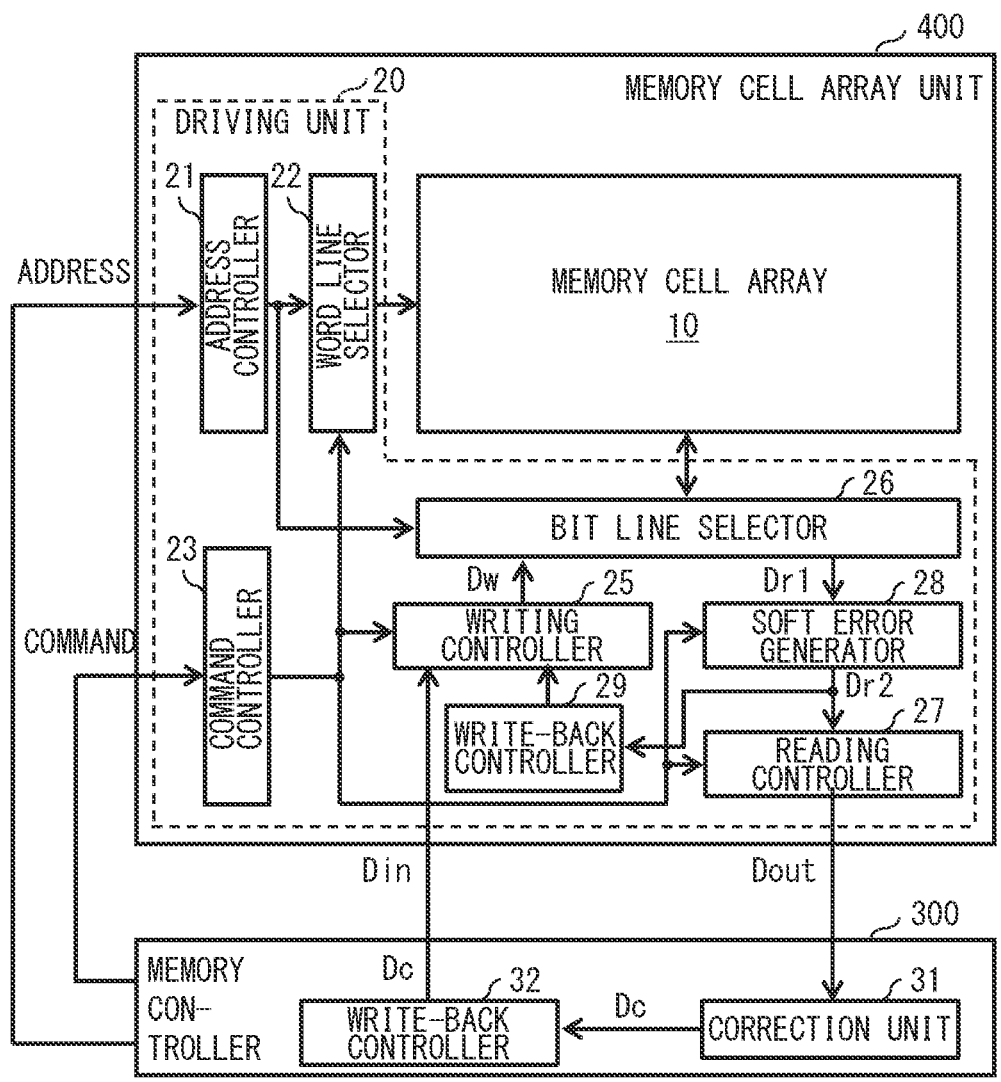

[ FIG. 10 ]
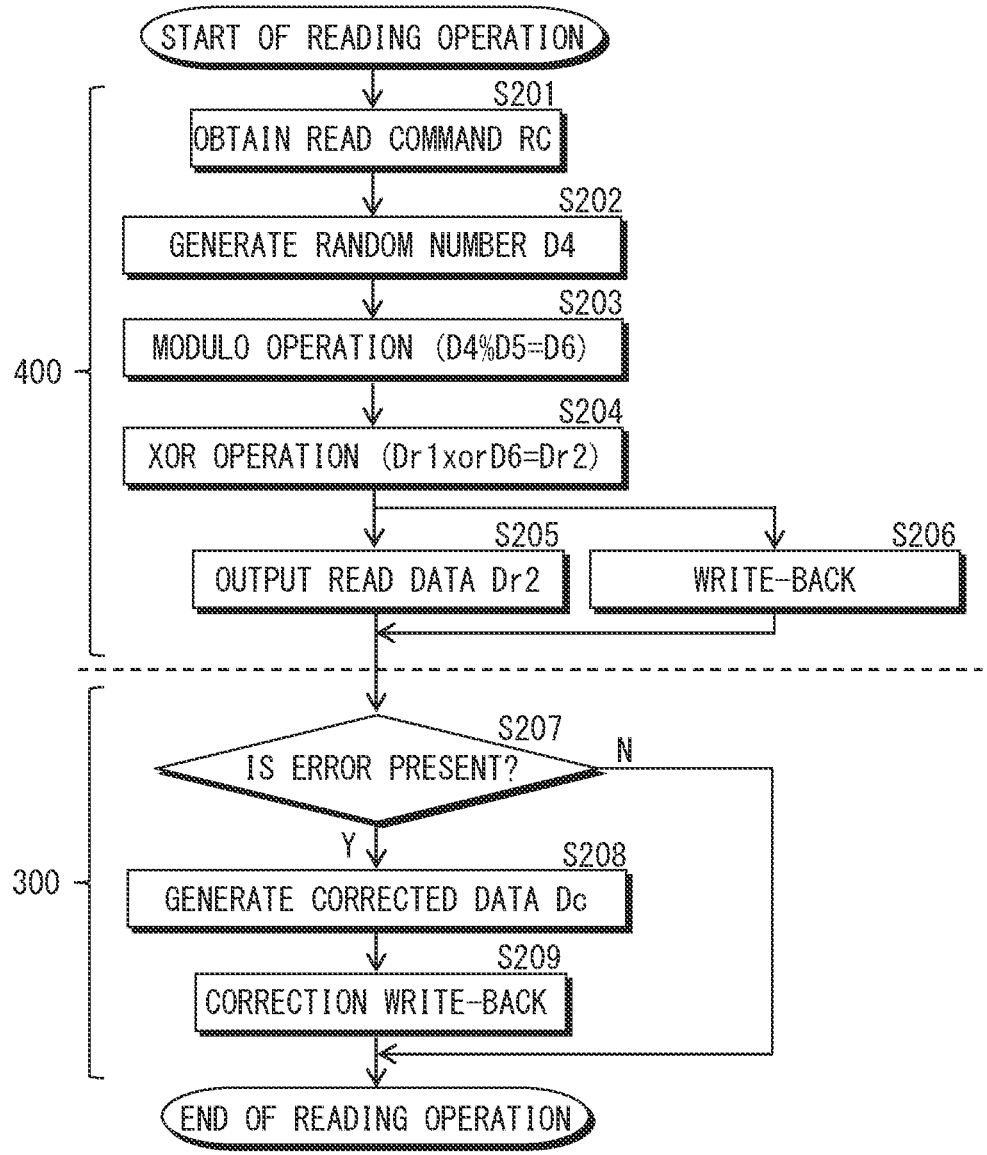

[ FIG. 11 ]
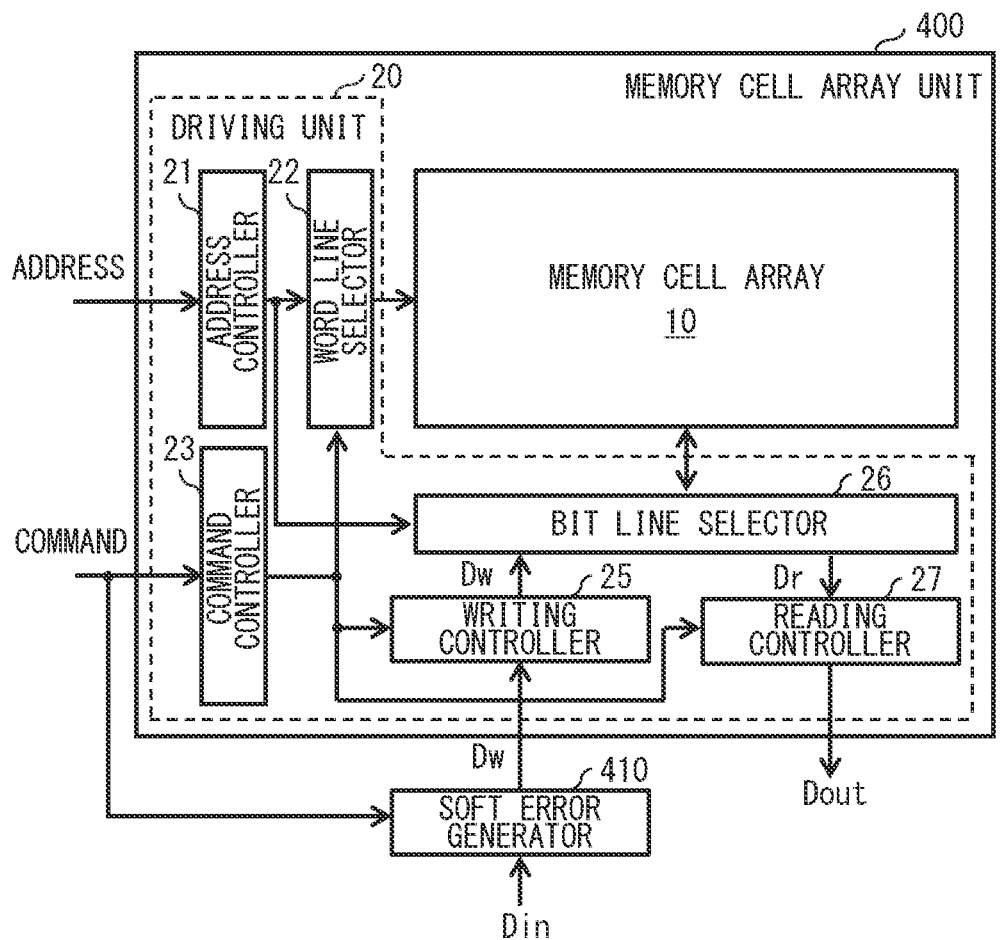

[ FIG. 12 ]
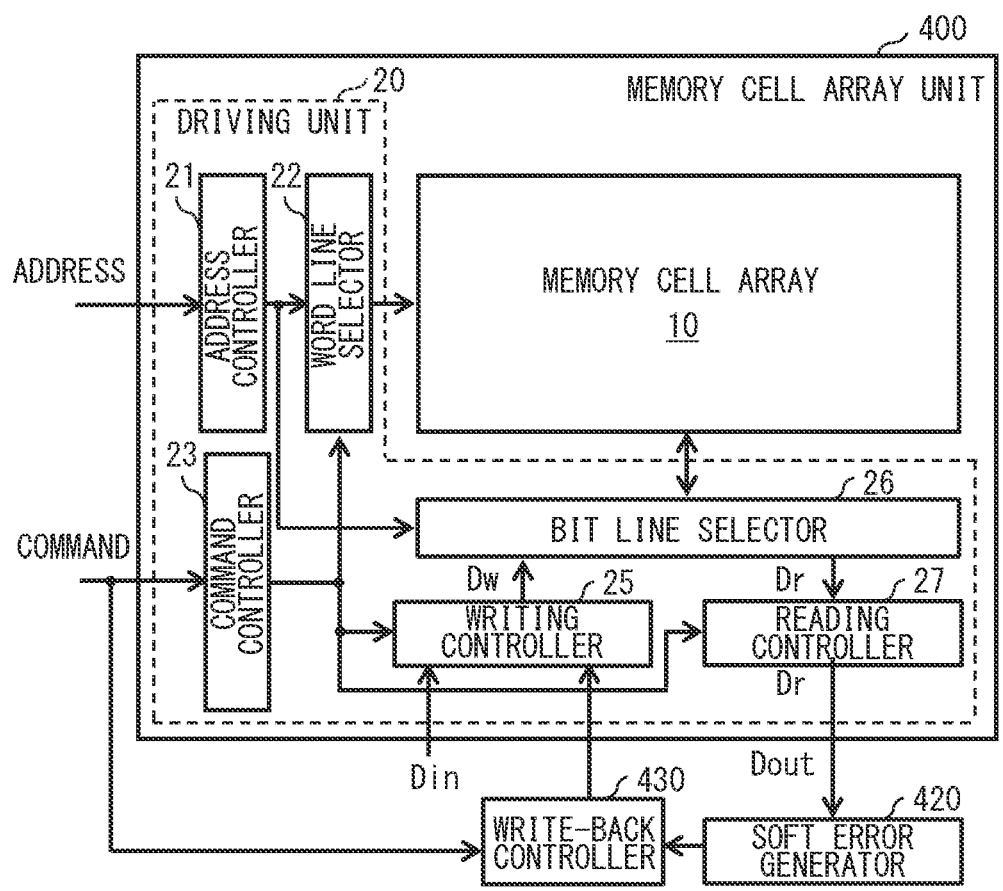

MEMORY SYSTEM AND MEMORY OPERATION

CROSS REFERENCE TO RELATED APPLICATIONS

This application is a U.S. National Phase of International Patent Application No. PCT/JP2021/019164 filed on May 20, 2021, which claims priority benefit of Japanese Patent Application No. JP 2020-124039 filed in the Japan Patent Office on Jul. 20, 2020. Each of the above-referenced applications is hereby incorporated herein by reference in its entirety.

TECHNICAL FIELD

The present disclosure relates to a memory system and a memory operation program.

BACKGROUND ART

In a case where a non-volatile memory is disconnected or short-circuited in a non-volatile memory cell array, data read from the non-volatile memory always has the same value. Such an address-specific failure is referred to as a hard failure (hard error). Inventions of error generators that reproduce a hard error have been proposed (see PTLs 1 to 3, for example).

CITATION LIST

Patent Literature

PTL 1: Japanese Unexamined Patent Application Publication No. 2008-090646
PTL 2: Japanese Unexamined Patent Application Publication No. 2008-181609
PTL 3: Japanese Unexamined Patent Application Publication No. 2008-217848

SUMMARY OF THE INVENTION

However, in a non-volatile memory cell array, in a case where writing is repeatedly performed under the same condition, on very rare occasion, it is not possible to correctly perform writing to a resistance variable device. Such an error is referred to as an establishment error (soft error). The inventions described in PTLs 1 to 3 described above have an issue that it is not possible to reproduce such a soft error and it is not possible to verify a correction function for the soft error. It is therefore desirable to provide a memory system and a memory operation program that make it possible to reproduce a soft error.

A memory system according to a first aspect of the present disclosure includes a soft error generator that generates write data or read data considering a probability error by using a random number.

A memory operation program according to a second aspect of the present disclosure causes a computer to execute generating write data or read data considering a probability error by using a random number.

In the memory system according to the first aspect of the present disclosure and the memory operation program according to the second aspect of the present disclosure, the write data or the read data considering a probability error is generated by using the random number. Herein, whether or not an error occurs is randomly changed depending on the random number. Accordingly, an error stochastically occurs, which makes it possible to reproduce a soft error.

A memory system according to a third aspect of the present disclosure includes a first soft error generator and a second soft error generator. The first soft error generator generates write data considering a probability error by using a first random number. The second soft error generator generates read data considering a probability error by using a second random number.

A memory operation program according to a fourth aspect of the present disclosure causes a computer to execute: generating write data considering a probability error by using a first random number; and generating read data considering a probability error by using a second random number.

In the memory system according to the third aspect of the present disclosure and the memory operation program according to the fourth aspect of the present disclosure, the write data considering a probability error is generated by using the first random number, and the read data considering a probability error is generated by using the second random number. Herein, whether or not an error occurs is randomly changed depending on the random number. Accordingly, an error stochastically occurs, which makes it possible to reproduce a soft error.

BRIEF DESCRIPTION OF THE DRAWINGS

FIG. 1 is a diagram illustrating an example of functional blocks of an information processing system according to an embodiment.
FIG. 2 is a diagram illustrating an example of functional blocks of a memory cell array unit in FIG. 1.
FIG. 3 is a diagram illustrating an example of functional blocks of a soft error generator in FIG. 2.
FIG. 4 is a diagram illustrating an example of a writing operation in the memory cell array unit in FIG. 1.
FIG. 5 is a diagram illustrating a modification example of functional blocks of the memory cell array unit in FIG. 1.
FIG. 6 is a diagram illustrating an example of functional blocks of a soft error generator in FIG. 5.
FIG. 7 is a diagram illustrating an example of a reading operation in the memory cell array unit in FIG. 5.
FIG. 8 is a diagram illustrating a modification example of functional blocks of the memory cell array unit in FIG. 5.
FIG. 9 is a diagram illustrating a modification example of a memory controller that controls the memory cell array unit in FIG. 5.
FIG. 10 is a diagram illustrating an example of a correction write-back operation in the memory controller in FIG. 9.
FIG. 11 is a diagram illustrating a modification example of functional blocks of the memory cell array unit in FIG. 1.
FIG. 12 is a diagram illustrating a modification example of functional blocks of the memory cell array unit in FIG. 5.

MODES FOR CARRYING OUT THE INVENTION

In the following, some embodiments of the present disclosure are described with reference to the drawings. It is to be noted that in this specification and the drawings, components that have substantially the same functional configuration are indicated by the same reference signs, and thus redundant description thereof is omitted.

Embodiment

[Configuration]

FIG. 1 illustrates an example of functional blocks of an information processing system according to an embodiment. The information processing system includes a host computer 100 and a memory unit 200. The memory unit 200 includes a memory controller 300, one or more memory cell array units 400, and a power supply unit 500. It is to be noted that FIG. 1 illustrates an example of a state in which one memory cell array unit 400 is provided.

(Host Computer 100)

The host computer 100 controls the memory unit 200. Specifically, the host computer 100 issues a command that specifies a logic address of an access destination and supplies the command and data to the memory unit 200. The host computer 100 receives the data outputted from the memory unit 200. Here, the command is for controlling the memory unit 200, and includes, for example, a write command that instructs a writing process of the data, a read command that instructs a reading process of the data, or a reset command that instructs an erasing process of the data. In addition, the logic address is an address allocated for each region of an access unit when the host computer 100 accesses the memory unit 200 in an address space defined by the host computer 100.

(Memory Controller 300)

The memory controller 300 controls one or more memory cell array units 400. The memory controller 300 receives, from the host computer 100, the write command that specifies the logic address. Further, the memory controller 300 executes a writing process of data in accordance with the write command. In the writing process, the logic address is converted into a physical address and the data is written to the physical address. Here, the physical address is an address allocated in one or more memory cell array units 400 for each access unit when the memory controller 300 accesses one or more memory cell array units 400. When the memory controller 300 receives the read command that specifies the logic address, the memory controller 300 converts the logic address into the physical address and reads data from the physical address. The memory controller 300 then outputs, to the host computer 100, the thus-read data as read data. In addition, when the memory controller 300 receives, from the host computer 100, the reset command that specifies the logic address, the memory controller 300 converts the logic address into the physical address and erases the data written in the physical address.

(Power Supply Unit 500)

The power supply unit 500 supplies a desired voltage to one or more memory cell array units 400. The power supply unit 500 supplies, to a word line selector 22 to be described later, for example, a voltage used at the time of writing or at the time of reading, or the like. The power supply unit 500 supplies, to a command controller 23 to be described later, a voltage used at the time of writing or at the time of reading, or the like.

(Memory Cell Array Unit 400)

Next, description is given of the memory cell array unit 400. FIG. 2 illustrates an example of functional blocks of the memory cell array unit 400. The memory cell array unit 400 is configured by, for example, a semiconductor chip. The memory cell array unit 400 includes, for example, a memory cell array 10 and a driving unit 20. The driving unit 20 exchanges the command, the write data, the read data, etc., with, for example, the memory controller 300. For example, the driving unit 20 writes the data to the memory cell array 10 in accordance with the write command, and reads the data from the memory cell array 10 in accordance with the read command.

The driving unit 20 corresponds to a specific example of a "memory system" or a "memory operation program" in the present disclosure. In a case where the driving unit 20 corresponds to the specific example of the "memory system" in the present disclosure, the driving unit 20 is configured by hardware that implements a function of the driving unit 20. In a case where the driving unit 20 corresponds to the specific example of the "memory operation program" in the present disclosure, the driving unit 20 is stored, for example, in a volatile memory such as a DRAM (Dynamic Random Access Memory) or a non-volatile memory such as an EEPROM (Electrically Erasable Programmable Read-Only Memory) or a flash memory and the driving unit 20 is loaded on a CPU (Central Processing Unit), thereby causing the CPU to implement the function of the driving unit 20.

(Memory Cell Array 10)

The memory cell array 10 is, for example, a so-called STT-MRAM (Spin Transfer Torque Magnetic Random Access Memory). The memory cell array 10 includes a plurality of memory cells MC. The memory cells MC each include a resistance variable device and a switch device that controls a current to flow to the resistance variable device.

The resistance variable device is, for example, a memory device that includes a magnetic tunnel junction. The resistance variable device has, for example, a fix layer (RL) and a free layer (FL), and has an extremely thin tunnel insulation film layer between the fix layer (RL) and the free layer (FL). In the resistance variable device, by changing a direction of magnetization of the free layer (FL), the stored data (an electrical resistance value) is rewritten. In the resistance variable device, when the direction of magnetization of the free layer (FL) is changed, electrons whose orientations of spin are uniform are injected into the resistance variable device MTJ. The spin of the injection electrons is opposite to the electron spin of the free layer (FL); therefore, a torque based on the spin of the injection electrons becomes the torque that moves the electron spin of the free layer (FL), and finally, an orientation of the electron spin of the free layer (FL) is reversed (magnetization reversal).

The memory cell array 10 has, for example, a plurality of word lines WL, a plurality of bit lines BL, a plurality of memory cells MC disposed one by one for each position where the word line WL and the bit line BL are opposed to each other, and a plurality of source lines SL. In the memory cell array 10, it is possible to write data to the memory cell MC specified by an external address input. Further, it is possible to read data stored in the memory cell MC specified by the address input. A data value stored in the memory cell MC is distinguished by a resistance state of the resistance variable device. For example, if the resistance state is a high resistance state, the data value is distinguished as "1" and if the resistance state is a low resistance state, the data value is distinguished as "0". It is to be noted that the physical state with respect to logic data is not limited to that described above, and if the resistance state is the high resistance state, the data value may be distinguished as "0" and if the resistance state is the low resistance state, the data value may be distinguished as "1". In addition, the physical state with respect to the logic data may be changed for each address.

(Driving Unit 20)

Next, description is given of the driving unit 20. The driving unit 20 includes, for example, an address controller 21, the word line selector 22, the command controller 23, a soft error generator 24, a writing controller 25, a bit line selector 26, and a reading controller 27, as illustrated in FIG. 2.

The address controller 21 outputs, to the word line selector 22, a control signal corresponding to a row address inputted from an address line and outputs, to the bit line selector 26, a control signal corresponding to a column address inputted from the address line. The address controller 21 outputs, to the word line selector 22 and the bit line selector 26, a signal that controls a timing of changing an output voltage. The word line selector 22 includes a circuit that drives each word line WL with a predetermined voltage necessary for an operation of writing, reading, or resetting when performing the operation of writing, reading, or resetting. The word line selector 22 is coupled to each word line WL of the memory cell array 10, and selects a word line WL corresponding to a row address inputted from an address line. The word line selector 22 outputs a predetermined voltage necessary for the operation of writing, reading or resetting to the selected word line WL.

The bit line selector 26 includes a circuit that drives the bit line BL coupled to the memory cell MC to which data "0" is to be written with a predetermined voltage necessary for a writing operation of the data "0", when performing the writing operation of the data "0", e.g., when performing an operation of changing the state of the resistance variable device of the memory cell MC from the high resistance state or the low resistance state to the low resistance state. The bit line selector 26 further includes a circuit that drives the bit line BL coupled to the memory cell MC to which data "1" is to be written with a predetermined voltage necessary for a writing operation of the data "1", when performing the writing operation of the data "1", e.g., when performing an operation of changing the state of the resistance variable device of the memory cell MC from the high resistance state or the low resistance state to the high resistance state. The bit line selector 26 further includes a circuit that drives the bit line BL coupled to the memory cell MC from which data is to be read with a predetermined voltage that does not cause rewriting, when performing a reading operation of the data.

The bit line selector 26 is coupled to each bit line BL of the memory cell array 10, and selects a corresponding bit line BL in accordance with a column address inputted from an address line. The bit line selector 26 outputs, to the selected bit line BL, a predetermined voltage necessary for the operation of writing, reading or resetting.

The command controller 23 controls the word line selector 22, the soft error generator 24, the writing controller 25, and the reading controller 27 in accordance with an inputted command. For example, in a case where a write command is inputted to the command controller 23, the command controller 23 instructs the soft error generator 24 to generate write data Dw including a soft error. The soft error generator 24 generates the write data Dw including the soft error on the basis of data (input data Din) inputted from the memory controller 300.

The command controller 23 further instructs the writing controller 25 to output the write data Dw inputted from the soft error generator 24 to the bit line selector 26 at a predetermined timing, and instructs the word line selector 22 to scan the memory cell array 10 at a predetermined timing. The writing controller 25 outputs the write data Dw inputted from the soft error generator 24 to the bit line selector 26 at the predetermined timing. The command controller 23 further instructs the reading controller 27 to read written data from the memory cell array 10. The reading controller 27 outputs the thus-read data (read data Dr) as output data Dout to the memory controller 300.

FIG. 3 illustrates an example of functional blocks of the soft error generator 24. The soft error generator 24 includes, for example, a random number generator 24a, a probability error register 24b, a MOD operator 24c, and a XOR operator 24d, as illustrated in FIG. 3.

The random number generator 24a generates a random number D1 with the obtainment of a write command WC as a trigger. The random number generator 24a generates the random number D1 by, for example, a method described in Japanese Unexamined Patent Application Publication No. 2001-344094. The probability error register 24b is a register having a specified register value D2 for generation of a soft error. The register value D2 is a fixed value stored in the probability error register 24b. The MOD operator 24c performs a modulo operation (D1%D2) with use of the random number D1 generated by the random number generator 24a and the register value D2 read from the probability error register 24b, and outputs a thus-obtained remainder D3 to the XOR operator 24d. The XOR operator 24d performs a XOR operation on the remainder D3 inputted from the MOD operator 24c and data (input data Din) inputted from the memory controller 300, and outputs a thus-obtained value as the write data Dw to the writing controller 25. The write data Dw may include a soft error or may not include a soft error. In a case where the write data Dw does not include a soft error, the write data Dw is equal to the input data Din. In other words, it can be said that the write data Dw is data considering a probability error.

Next, description is given of a writing operation in the memory cell array unit 400. FIG. 4 illustrates an example of the writing operation in the memory cell array unit 400. First, in a case where the random number generator 24a obtains the write command WC from the memory controller 300 (command controller 23), the random number generator 24a generates the random number D1 with the obtainment of the write command WC as a trigger (steps S101 and S102). Next, the MOD operator 24c performs a modulo operation (D1%D2) with use of the random number D1 generated by the random number generator 24a and the register value D2 read from the probability error register 24b (step S103). As a result, the remainder D3 is obtained. The MOD operator 24c outputs the obtained remainder D3 to the XOR operator 24d.

In a case where the XOR operator 24d obtains the remainder D3 from the MOD operator 24c, the XOR operator 24d performs a XOR operation with the obtainment of the remainder D3 as a trigger (step S104). Specifically, the XOR operator 24d performs the XOR operation on the remainder D3 inputted from the MOD operator 24c and the data (input data Din) inputted from the memory controller 300. The XOR operator 24d outputs a thus-obtained value as the write data Dw to the writing controller 25.

The writing controller 25 outputs the write data Dw inputted from the soft error generator 24 to the bit line selector 26 at a predetermined timing. The word line selector 22 and the bit line selector 26 store the write data Dw in a predetermined address of the memory cell array 10 in accordance with timing control and applied voltage control by the address controller 21 (step S105). Thereafter, the bit line selector 26 reads the write data Dw from the predetermined address of the memory cell array 10 as necessary. The reading controller 27 outputs the write data Dw obtained by the bit line selector 26 as output data Dout to the memory controller 300. In this way, the writing operation in the memory cell array unit 400 is performed.

[Effects]

Next, description is given of effects of the information processing system according to the present embodiment.

In a case where a non-volatile memory is disconnected or short-circuited in a non-volatile memory cell array, data read from the non-volatile memory always has the same value. Such an address-specific failure is referred to as a hard failure (hard error). Inventions of error generators that reproduce a hard error have been proposed in PTLs 1 to 3 described above.

However, in the non-volatile memory cell array, in a case where writing is repeatedly performed under the same condition, on very rare occasion, it is not possible to correctly perform writing to a resistance variable device. Such an error is referred to as an establishment error (soft error). The inventions described in PTLs 1 to 3 described above have an issue that it is not possible to reproduce such a soft error and it is not possible to verify a correction function for the soft error.

In contrast, in the present embodiment, the write data Dw considering a soft error is generated with use of the random number D1. Herein, whether or not an error occurs is randomly changed depending on the random number D1. Accordingly, an error stochastically occurs, which makes it possible to reproduce a soft error. It is therefore possible to reproduce a success probability of writing to the memory cell array 10. It is to be noted that, for example, it is possible to verify a correction function for a soft error with use of the thus-generated write data Dw that is stored in the memory cell array 10 and then read anew from the memory cell array 10.

In addition, in the present embodiment, the modulo operation is performed with use of the random number D1 and the register value D2 (fixed value), and the write data Dw is generated with use of the thus-obtained remainder D3 and the input data Din. This make it possible to stochastically cause the occurrence of an error and reproduce a soft error.

In addition, in the present embodiment, the XOR operation is performed with use of the remainder D3 and the input data Din, and a thus-obtained value serves as the write data Dw. This make it possible to stochastically cause the occurrence of an error and reproduce a soft error.

MODIFICATION EXAMPLES

Next, description is given of modification examples of the information processing system according to the embodiment described above.

Modification Example A

FIG. 5 illustrates a modification example of the memory cell array unit 400 according to the embodiment described above. The present modification example differs from the memory cell array unit 400 according to the embodiment described above in that the soft error generator 24 is omitted and a soft error generator 28 and a write-back controller 29 are added.

FIG. 6 illustrates an example of functional blocks of the soft error generator 28. The soft error generator 28 includes, for example, a random number generator 28a, a probability error register 28b, a MOD operator 28c, and a XOR operator 28d, as illustrated in FIG. 6.

The random number generator 28a generates a random number D4 with obtainment of a read command RC as a trigger. The random number generator 28a generates the random number D4 by, for example, a method described in Japanese Unexamined Patent Application Publication No. 2001-344094. The probability error register 28b is a register having a specified register value D5 for generation of a soft error. The MOD operator 28c performs a modulo operation (D4%D5) with use of the random number D4 generated by the random number generator 28a and the register value D5 read from the probability error register 28b, and outputs a thus-obtained remainder D6 to the XOR operator 28d. The XOR operator 28d performs a XOR operation on the remainder D6 inputted from the MOD operator 28c and data (read data Dr1) read from the memory cell array 10 by the bit line selector 26, and outputs a thus-obtained value as read data Dr2 to the reading controller 27. The read data Dr2 may include a soft error or may not include a soft error. In a case where the read data Dr2 does not include a soft error, the read data Dr2 is equal to the read data Dr1.

The read data Dr1 is data written to the memory cell array 10 by the driving unit 20. The read data Dr1 is, for example, the input data Din inputted from the memory controller 300.

In the present modification example, the reading controller 27 outputs the data (read data Dr2) inputted from the soft error generator 28 as the output data Dout to the memory controller 300. The write-back controller 29 outputs the data (read data Dr2) outputted from the soft error generator 28 to the writing controller 25. In a case where the read data Dr2 is inputted from the write-back controller 29 to the writing controller 25, the writing controller 25 writes the read data Dr2 to the memory cell array with the obtainment of the read data Dr2 as a trigger to overwrite the read data Dr1.

Next, description is given of a reading operation in the memory cell array unit 400. FIG. 7 illustrates an example of the reading operation in the memory cell array unit 400. First, in a case where the random number generator 28a obtains the read command RC from the memory controller 300 (command controller 23), the random number generator 28a generates the random number D4 with the obtainment of the read command RC as a trigger (steps S201 and S202). Next, the MOD operator 28c performs a modulo operation (D4%D5) with use of the random number D4 generated by the random number generator 28a and the register value D5 read from the probability error register 28b (step S203). As a result, the remainder D6 is obtained. The MOD operator 28c outputs the obtained remainder D6 to the XOR operator 28d.

In a case where the XOR operator 28d obtains the remainder D6 from the MOD operator 28c, the XOR operator 28d performs a XOR operation with the obtainment of the remainder D6 as a trigger (step S204). Specifically, the XOR operator 28d performs the XOR operation on the remainder D6 inputted from the MOD operator 28c and the data (read data Dr1) read from the memory cell array 10 by the bit line selector 26. The XOR operator 28d outputs a thus-obtained value as the read data Dr2 to the reading controller 27 and the write-back controller 29.

The reading controller 27 outputs the data (read data Dr2) inputted from the soft error generator 28 as the output data Dout to the memory controller 300 (step S205). The write-back controller 29 outputs the data (read data Dr2) inputted from the soft error generator 28 to the writing controller 25. In a case where the read data Dr2 is inputted from the write-back controller 29 to the writing controller 25, the writing controller 25 writes the read data Dr2 to the memory cell array 10 with the obtainment of the read data Dr2 as a trigger to overwrite the read data Dr1. Thus, write-back of the read data Dr2 is performed (step S206). In this way, the reading operation in the memory cell array unit 400 is performed.

In the present modification example, the read data Dr2 considering a soft error is generated with use of the random number D4. Herein, whether or not an error occurs is randomly changed depending on the random number D4. Accordingly, an error stochastically occurs, which makes it possible to reproduce a soft error. It is therefore possible to reproduce an erasure probability of data held in the memory cell array 10, and a write error probability resulting from a read current to flow to the memory cell array 10 at the time of reading the held data from the memory cell array 10. Incidentally, in a case where data destruction occurs due to a disturbance (e.g., an external magnetic field) that is one of soft errors, it is not possible to eliminate the soft error by re-executing the reading operation. In contrast, in the present modification example, proper data in which the error has been corrected is written to the memory cell array 10. This makes it possible to eliminate the soft error.

In addition, in the present modification example, the modulo operation is performed with use of the random number D4 and the register value D5 (fixed value), and the read data Dr2 is generated with use of the thus-obtained remainder D6 and the read data Dr1. This make it possible to stochastically cause the occurrence of an error and reproduce a soft error.

In addition, in the present modification example, the XOR operation is performed with use of the remainder D6 and the read data Dr1, and a thus-obtained value serves as the read data Dr2. This make it possible to stochastically cause the occurrence of an error and reproduce a soft error.

In addition, in the present modification example, the read data Dr2 is written to the memory cell array 10 to overwrite the read data Dr1. This makes it possible to read the read data Dr2 from the memory cell array 10 anew and verify the correction function for the soft error with use of the read data Dr2 read. Incidentally, in a case where data destruction occurs due to a disturbance (e.g., an external magnetic field) that is one of soft errors, it is not possible to eliminate the soft error by re-executing the reading operation. In contrast, in the present modification example, proper data in which the error has been corrected is written to the memory cell array 10. This makes it possible to eliminate the soft error.

Modification Example B

FIG. 8 illustrates a modification example of the memory cell array unit 400 according to the modification example A described above. The present modification example differs from the memory cell array unit 400 according to the modification example A described above in that the soft error generator 24 is added.

In the present modification example, the soft error generator 24 generates data (write data Dw) that may include a soft error at the time of writing, and the generated write data Dw is stored in the memory cell array 10 by the writing controller 25 and the bit line selector 26. The write data Dw stored in the memory cell array 10 is read as the read data Dr1 from the memory cell array 10 by the bit line selector 26. Data (read data Dr2) that may include a soft error at the time of reading is generated by the soft error generator 28 with use of the read data Dr1 read from the memory cell array 10.

Accordingly, it is possible to reproduce a success probability of writing to the memory cell array 10, an erasure probability of data held in the memory cell array 10, and a write error probability resulting from a read current to flow to the memory cell array 10 at the time of reading the held data from the memory cell array 10. Incidentally, in a case where data destruction occurs due to a disturbance (e.g., an external magnetic field) that is one of soft errors, it is not possible to eliminate the soft error by re-executing the reading operation. In contrast, in the present modification example, proper data in which the error has been corrected is written to the memory cell array 10. This makes it possible to eliminate the soft error.

Modification Example C

FIG. 9 illustrates a modification example of the memory controller 300 that controls the memory cell array unit 400 according to the modification example A described above. In the present modification example, the memory controller 300 includes, for example, a correction unit 31 and a write-back controller 32 as illustrated in FIG. 9.

The correction unit 31 compares, for example, the output data Dout inputted from the memory cell array unit 400 (reading controller 27) with the input data Din outputted to the memory cell array unit 400 (writing controller 25) to determine presence or absence of an error in the output data Dout. In a case where it is the output data Dout is determined as having an error, the correction unit 31 corrects the output data Dout with use of, for example, an error correction code (e.g., an ECC (Error Correction Code) parity) included in the output data Dout. The correction unit 31 outputs data (corrected data Dc) obtained by the correction to the write-back controller 32. The write-back controller 32 outputs the corrected data Dc inputted from the correction unit 31 to the memory cell array unit 400 (writing controller 25).

In a case where the corrected data Dc is inputted from the memory controller 300 to the writing controller 25, the writing controller 25 outputs the inputted corrected data Dc as the write data Dw to the bit line selector 26. The bit line selector 26 writes the write data Dw inputted from the writing controller 25 to the memory cell array 10 to overwrite the read data Dr1, thereby performing correction write-back.

Next, description is given of a correction write-back operation in the memory controller 300. FIG. 10 illustrates an example of the reading operation in the memory cell array unit 400 and an example of the correction write-back operation in the memory controller 300. First, the memory cell array unit 400 executes the steps S201 to S206 described above.

Next, in the memory controller 300, the correction unit 31 compares, for example, the output data Dout inputted from the memory cell array unit 400 (reading controller 27) with the input data Din outputted to the memory cell array unit 400 (writing controller 25) to determine presence or absence of an error in the output data Dout (step S207). In a case where the output data Dout is determined as having no error (step S207; N), the correction unit 31 ends the correction write-back operation and ends the reading operation.

Meanwhile, in a case where the output data Dout is determined as having an error (step S207; Y), the correction unit 31 corrects the output data Dout with use of, for example, an error correction code included in the output data Dout to thereby generate the corrected data Dc (step S208). The correction unit 31 outputs the corrected data Dc obtained by the correction to the write-back controller 32. The write-back controller 32 outputs the corrected data Dc inputted from the correction unit 31 to the memory cell array unit 400 (writing controller 25).

In a case where the corrected data Dc is inputted from the memory controller 300 to the writing controller 25, the writing controller 25 outputs the inputted corrected data Dc as the write data Dw o the bit line selector 26. The bit line selector 26 writes the write data Dw inputted from the writing controller 25 to the memory cell array 10 to overwrite the read data Dr1, thereby performing correction write-back (step S209).

In the present modification example, in a case where the output data Dout has an error, data (corrected data Dc) having been subjected to error correction is written to the memory cell array 10 to overwrite the read data Dr1. This makes it possible to supply data including no soft error to the soft error generator 28, which makes it possible to verify the correction function for a soft error, for example.

Modification Example

FIG. 11 illustrates a modification example of the memory cell array unit 400 according to the embodiment descried above. In the modification example, in the memory cell array unit 400, the soft error generator 24 is omitted, and a soft error generator 410 having a function similar to that of the soft error generator 24 is provided separately from the memory cell array unit 400. In this case, the driving unit 20 and the soft error generator 410 correspond to specific examples of a "memory system" or a "memory operation program" in the present disclosure.

In such a case, it is not necessary to mount the soft error generator 410 that is not necessary for a user on the memory cell array unit 400. In addition, in a case where modification of the soft error generator 410 (e.g., change of a random number generation algorithm) is necessary, it is not necessary to recreate the memory cell array unit 400, which makes it possible to reduce modification cost.

In addition, in the present modification example, the soft error generator 410 is provided separately from the memory cell array unit 400, which makes it possible to configure the soft error generator 410 by software (program) and configure the driving unit 20 by hardware. In this case, for example, an information processing device on which the soft error generator 410 that is software (program) is installed is used to control the operation of the memory cell array unit 400.

Modification Example E

FIG. 12 illustrates a modification example of the memory cell array unit 400 according to the modification example A described above. In the present modification example, in the memory cell array unit 400, the soft error generator 28 and the write-back controller 29 are omitted, and a soft error generator 420 having a function similar to that of the soft error generator 28 and a write-back controller 430 having a function similar to that of the write-back controller 29 are provided separately from the memory cell array unit 400. In this case, the driving unit 20, the soft error generator 420, and the write-back controller 430 correspond to specific examples of a "memory system" or a "memory operation program" in the present disclosure.

In such a case, it is not necessary to mount the soft error generator 420 and the write-back controller 430 that are not necessary for a user on the memory cell array unit 400. In addition, in a case where modification of the soft error generator 420 (e.g., change of a random number generation algorithm) is necessary, it is not necessary to recreate the memory cell array unit 400, which makes it possible to reduce modification cost.

In addition, in the present modification example, the soft error generator 420 and the write-back controller 430 are provided separately from the memory cell array unit 400, which makes it possible to configure the soft error generator 420 and the write-back controller 430 by software (program) and configure the driving unit 20 by hardware. In this case, for example, an information processing device on which the soft error generator 420 and the write-back controller 430 that are software (program) is installed is used to control the operation of the memory cell array unit 400.

Although the present disclosure has been described with reference to the embodiment and the modification examples thereof, the present disclosure is not limited to the embodiment described above and the like, and may be modified in a variety of ways. In the embodiment described above and the like, the memory cell array 10 is a STT-MRAM. However, in the embodiment described above and the like, the memory cell array 10 may be a MRAM different from the STT-MRAM, or may be a non-volatile memory different from the MRAM.

It is to be noted that the effects described herein are merely illustrative. The effects of the present disclosure are not limited to those described herein. The present disclosure may have effects other than those described herein.

In addition, for example, the present disclosure may also have the following configurations.

(1)

A memory system including a soft error generator that generates write data or read data considering a probability error by using a random number.

(2)

The memory system according to (1), in which the soft error generator performs a modulo operation with use of the random number and a fixed value, and generates the write data with use of a thus-obtained remainder and input data.

(3)

The memory system according to (1), in which the soft error generator performs a modulo operation with use of the random number and a fixed value, and generates the read data with use of a thus-obtained remainder and data read from a memory.

(4)

The memory system according to (2), in which
the soft error generator includes
a random number generator that generates the random number,
a register having the fixed value that is specified,
a first operator that performs the modulo operation, and
a second operator that generates the write data.

(5)

The memory system according to (4), in which the second operator performs a XOR operation with use of the remainder and the input data, and a thus-obtained value serves as the write data.

(6)

The memory system according to (3), in which
the soft error generator includes
a random number generator that generates the random number,
a register having the fixed value that is specified,
a first operator that performs the modulo operation, and
a second operator that generates the read data.

(7)

The memory system according to (6), in which the second operator performs a XOR operation with use of the remainder and the input data, and a thus-obtained value serves as the read data.

(8)

The memory system according to (3), further including a writing unit that writes the read data to the memory to overwrite the memory data.

(9)

The memory system according to (2) further including:
a memory; and
a writing controller that writes the write data to the memory.

(10)

The memory system according to (3) further including:
a memory;
a writing controller that writes the read data to the memory; and
a reading controller that reads the read data from the memory.

(11)

A memory system including:
a first soft error generator that generates write data considering a probability error by using a first random number; and
a second soft error generator that generates read data considering a probability error by using a second random number.

(12)

The memory system according to (11), in which
the first soft error generator performs a modulo operation with use of the first random number and a first fixed value, and generates the write data with use of a thus-obtained first remainder and input data, and
the second soft error generator performs a modulo operation with use of the second random number and a second fixed value, and generates the read data with use of a thus-obtained second remainder and data read from a memory.

(13)

A memory operation program that causes a computer to execute generating write data or read data considering a probability error by using a random number.

(14)

A memory operation program that causes a computer to execute:
generating write data considering a probability error by using a first random number; and
generating read data considering a probability error by using a second random number.

In a memory system according to a first aspect of the present disclosure and a memory operation program according to a second aspect of the present disclosure, write data or read data considering a probability error is generated by using a random number; therefore, an error stochastically occurs. This makes it possible to reproduce a soft error.

In a memory system according to a third aspect of the present disclosure and a memory operation program according to a fourth aspect of the present disclosure, write data considering a probability error is generated by using a first random number, and read data considering a probability error is generated by using a second random number; therefore, an error stochastically occurs. This makes it possible to reproduce a soft error.

This application claims the priority on the basis of Japanese Patent Application No. 2020-124039 filed with Japan Patent Office on Jul. 20, 2020, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A memory system, comprising:
a bit line selector;
a soft error generator configured to generate one of write data or read data based on a probability error and a specific number; and
a writing controller configured to output, at a specific timing, the write data to the bit line selector, wherein the bit line selector is configured to store the write data in a specific address of a memory based on a specific voltage.

2. The memory system according to claim 1, wherein the soft error generator is further configured to:
perform a modulo operation based on the specific number and a fixed value; and
generate the write data based on a remainder value and input data.

3. The memory system according to claim 1, wherein the soft error generator is further configured to:
perform a modulo operation based on the specific number and a fixed value; and
generate the read data based on a remainder value and first data from the memory.

4. The memory system according to claim 2, wherein the soft error generator includes:
a number generator configured to generate the specific number,
a register having the fixed value,
a first operator configured to perform the modulo operation, and
a second operator configured to generate the write data.

5. The memory system according to claim 4, wherein
the second operator is further configured to perform a XOR operation based on the remainder value and the input data, and
a first value serves as the write data.

6. The memory system according to claim 3, wherein the soft error generator includes:
a number generator configured to generate the specific number,
a register having the fixed value,
a first operator configured to perform the modulo operation, and
a second operator configured to generate the read data.

7. The memory system according to claim 6, wherein
the second operator is further configured to perform a XOR operation based on the remainder value and input data, and
a first value serves as the read data.

8. The memory system according to claim 3, further comprising a writing unit configured to write the read data to the memory, wherein the read data overwrites the first data.

9. A memory system, comprising:
a bit line selector;
a first soft error generator configured to generate write data based on a first probability error and a first number;
a second soft error generator configured to generate read data based on a second probability error and a second number; and
a writing controller configured to output, at a specific timing, the write data to the bit line selector, wherein the bit line selector is configured to store the write data in a specific address of a memory based on a specific voltage.

10. The memory system according to claim 9, wherein the first soft error generator is further configured to:
  perform a first modulo operation based on the first number and a first fixed value; and
  generate the write data based on a first remainder value and input data, and
the second soft error generator is further configured to:
  perform a second modulo operation based on the second number and a second fixed value; and
  generate the read data based on a second remainder value and first data from the memory.

11. A non-transitory computer-readable medium having stored thereon, computer-executable instructions which, when executed by a processor, cause the processor to execute operations, the operations comprising:
  generating one of write data or read data based on a probability error and a specific number;
  outputting the write data at a specific timing; and
  storing the write data in a specific address of a memory based on a specific voltage.

12. A non-transitory computer-readable medium having stored thereon, computer-executable instructions which, when executed by a processor, cause the processor to execute operations, the operations comprising:
  generating write data based on a first probability error and a first number;
  generating read data based on a second probability error and a second number;
  outputting the write data at a specific timing; and
  storing the write data in a specific address of a memory based on a specific voltage.

* * * * *